(12) United States Patent
Nagumo et al.

(10) Patent No.: US 10,084,229 B2
(45) Date of Patent: Sep. 25, 2018

(54) ANTENNA APPARATUS

(75) Inventors: Shoji Nagumo, Kyoto-fu (JP); Masaaki Takata, Kyoto-fu (JP); Noriyuki Ueki, Kyoto-fu (JP); Hiromasa Koyama, Kyoto-fu (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 793 days.

(21) Appl. No.: 13/404,039

(22) Filed: Feb. 24, 2012

(65) Prior Publication Data

US 2012/0154245 A1    Jun. 21, 2012

Related U.S. Application Data

(63) Continuation of application No. PCT/JP2010/056431, filed on Apr. 9, 2010.

(30) Foreign Application Priority Data

Aug. 25, 2009   (JP) ................ 2009-194738

(51) Int. Cl.
*H01Q 5/335* (2015.01)
*H01Q 1/24* (2006.01)
(Continued)

(52) U.S. Cl.
CPC ........... *H01Q 1/243* (2013.01); *H01Q 5/335* (2015.01); *H01Q 9/40* (2013.01); *H03H 7/40* (2013.01)

(58) Field of Classification Search
CPC ...... H01Q 5/0041; H01Q 1/243; H01Q 5/335; H03H 7/40
(Continued)

(56) References Cited

U.S. PATENT DOCUMENTS 3,381,222 A * 4/1968 Gray ................ 455/77
3,919,644 A * 11/1975 Smolka ............ 455/123
(Continued)

FOREIGN PATENT DOCUMENTS

CN   1767399 A   5/2006
CN   1830154 A   9/2006
(Continued)

OTHER PUBLICATIONS

International Search Report; PCT/JP2010/056431; dated Jul. 13, 2010.
(Continued)

*Primary Examiner* — Dameon E Levi
*Assistant Examiner* — Hasan Islam
(74) *Attorney, Agent, or Firm* — Studebaker & Brackett PC

(57) ABSTRACT

This disclosure provides an antenna apparatus in which stable antenna characteristics are maintained by detecting surrounding conditions that affect the antenna characteristics and appropriately compensating the antenna characteristics. More specifically, when surrounding condition such as a human body (e.g., a palm or fingers) approaches and enters an electric field of a pseudo dipole formed by an antenna element electrode, a stray capacitance is sensed and stable antenna characteristics are maintained by appropriately controlling an antenna matching circuit to compensate for a change in the antenna characteristics due to the approach of the surrounding condition.

8 Claims, 10 Drawing Sheets

(51) Int. Cl.
*H01Q 9/40* (2006.01)
*H03H 7/40* (2006.01)

(58) Field of Classification Search
USPC .................. 343/850, 852, 860, 861, 745
See application file for complete search history.

(56) References Cited

U.S. PATENT DOCUMENTS

| | | | |
|---|---|---|---|
| 5,867,127 A * | 2/1999 | Black et al. .................. | 343/702 |
| 6,219,532 B1 | 4/2001 | Tanaka et al. | |
| 6,462,716 B1 * | 10/2002 | Kushihi .................. | 343/860 |
| 6,765,540 B2 * | 7/2004 | Toncich .................. | 343/860 |
| 6,768,472 B2 * | 7/2004 | Alexopoulos ............ | H03H 7/40 330/144 |
| 7,764,236 B2 * | 7/2010 | Hill et al. .................. | 343/702 |
| 2003/0210203 A1 * | 11/2003 | Phillips .................. | H01Q 1/362 343/850 |
| 2004/0217909 A1 | 11/2004 | Maarala et al. | |
| 2005/0184922 A1 * | 8/2005 | Ida ...................... | H04B 1/0458 343/861 |
| 2005/0245204 A1 | 11/2005 | Vance | |
| 2006/0094486 A1 | 5/2006 | Cho | |
| 2007/0010217 A1 | 1/2007 | Takahashi et al. | |
| 2007/0281646 A1 * | 12/2007 | Itaya et al. .................. | 455/197.2 |
| 2009/0046030 A1 | 2/2009 | Song et al. | |
| 2009/0073076 A1 | 3/2009 | Skarp et al. | |

FOREIGN PATENT DOCUMENTS

| | | |
|---|---|---|
| GB | 2330965 A | 5/1999 |
| GB | 2330965 B | 8/2001 |
| JP | 2004-312157 A | 11/2004 |
| JP | 2006-222798 A | 8/2006 |
| JP | 3927918 B2 | 6/2007 |
| JP | 2007-536797 A | 12/2007 |
| WO | 2009/003510 A1 | 1/2009 |

OTHER PUBLICATIONS

Written Opinion of the International Searching Authority; PCT/JP2010/056431; dated Jul. 13, 2010.
The First Office Action issed by the State Intellectual Property Office of People's Republic of China dated Sep. 4, 2013, which corresponds to Chinese Patent Application No. 20080037709.9 and is related to U.S. Appl. No. 13/404,0389; with translation.

* cited by examiner

SENSING SIGNAL AREA

ANTENNA APPARATUS

CROSS REFERENCE TO RELATED APPLICATIONS

The present application is a continuation of International Application No. PCT/JP2010/056431 filed on Apr. 9, 2010, which claims priority to Japanese Patent Application No. 2009-194738 filed on Aug. 25, 2009, the entire contents of each of these applications being incorporated herein by reference in their entirety.

TECHNICAL FIELD

The invention relates to antenna apparatuses provided in, for example, cellular phones.

BACKGROUND

U.S. Patent Application Publication No. 2009/0046030 (PTL 1), International Publication No. 2009/033510 pamphlet (PTL 2), and U.S. Patent Application Publication No. 2004/0217909(PTL 3) disclose techniques for sensing surrounding conditions to compensate, by feedback control, antenna characteristics that change in accordance with the surrounding conditions such as an approaching human body.

In PTL 1, variation in the input impedance (return loss, VSWR) of an antenna caused by a change in surrounding conditions is directly measured. By providing a directional coupler on a line between an RF circuit and the antenna, power transmitted in a direction (input direction) from the RF circuit to the antenna and power transmitted in a direction (reflection direction) from the antenna to the RF circuit are monitored, thereby keeping track of the input impedance in the current state.

In PTL 2, a change in the strength of an electromagnetic wave radiated from an antenna is directly measured. A change in an electric field radiated from the antenna due to the effects of the surroundings is detected using a sensor such as a Hall element. Although the factors responsible for the change cannot be divided into a change in input impedance and an increased loss caused by absorption of the radiated electromagnetic wave by a nearby object, an overall change in the radiated electric field caused by these factors is detected.

In PTL 3, a distance to an approaching human body is measured. By using a light emitting/receiving device, a distance is measured on the basis of light reflected by a nearby object.

Here, the configuration of an antenna apparatus disclosed in PTL 2 is described with reference to FIG. 1.

The antenna apparatus is formed of an antenna 18, a high-frequency circuit 26 that inputs a radio frequency signal to the antenna 18, and several network components, and includes a first matching circuit 24 provided on a signal line between the antenna 18 and the high-frequency circuit 26, a controller 28, and a detector 10 that detects an electromagnetic field radiated from the antenna 18. The controller 28 performs matching control of the antenna 18 on the basis of a detected electric field.

SUMMARY

This disclosure provides an antenna apparatus that can appropriately compensate antenna characteristics by detecting the surrounding conditions that cause a change in the antenna characteristics, and appropriately control the antenna apparatus to maintain stable antenna characteristics.

In one aspect of the disclosure, an antenna apparatus includes an antenna element, a feed unit, an antenna matching circuit connected between the antenna element and the feed unit, a capacitance detection circuit, and a feedback control circuit. The capacitance detection circuit is connected to the antenna element and is configured to detect stray capacitance of the antenna element. The feedback control circuit is configured to control the antenna matching circuit in accordance with an output signal of the capacitance detection circuit.

In a more specific embodiment, the antenna apparatus may include a reactance element on a wireless communication signal path that is a transmission path between the antenna element and the feed unit, where the reactance element is configured to prevent infiltration of a sensing signal to be detected by the capacitance detection circuit is provided.

In another more specific embodiment, the antenna apparatus may include a reactance element on a sensing signal path that is a transmission path between the antenna element and the capacitance detection circuit, where the reactance element is configured to prevent leakage of a wireless communication signal fed to the antenna element or transmitted from the antenna element.

In yet another more specific embodiment, the capacitance detection circuit may be a capacitance-voltage conversion amplifier circuit that includes feedback capacitance in a feedback circuit of an inverting amplifier circuit, and that outputs a voltage which is approximately proportional to a rate of change of detection object capacitance to the feedback capacitance.

In still another more specific embodiment, the capacitance-voltage conversion amplifier circuit may include an AC signal source that generates an AC signal having a frequency sufficiently lower than a resonant frequency of the antenna element, the AC signal source being provided in an input section of the inverting amplifier circuit.

In another more specific embodiment, a detector circuit is in an output section of the inverting amplifier circuit and is configured to detect an output signal of the inverting amplifier circuit.

In another more specific embodiment, an integrating circuit is in an output section of the inverting amplifier circuit and is configured to integrate an output voltage of the inverting amplifier circuit.

In another more specific embodiment, the antenna element is an antenna element that, as the antenna element alone, has a satisfactory radiation Q factor among a plurality of types of antenna element that can be connected to an antenna connection section of the antenna matching circuit.

In yet another more specific embodiment, selection conditions for the plurality of types of antenna element may include a position of a feed point on the antenna element and a connection position of the capacitance detection circuit on the antenna element.

DETAILED DESCRIPTION

The inventors realized that the antenna apparatuses of PTLs 1-3 have significant drawbacks.

For instance, in the antenna apparatus disclosed in PTL 1, it is required that power be input to the antenna to keep track of the input impedance, and the antenna apparatus can only keep track of a change in the impedance in the transmission frequency band. It is desirable, however, to keep track of the "state of an antenna resonant system which is affected by external conditions," rather than a change in the input impedance for a particular frequency.

In the antenna apparatus disclosed in PTL 2, there is a problem in that, since a member which has nothing to do with radiation is provided, the antenna characteristics may be deteriorated. Further, from the viewpoint of unity of the antenna with a sensor, these components are only a combination of discrete bodies existing separately, and with a configuration in which one is included in a space occupied by the others, components in proximity to each other negatively affect the characteristics.

In an antenna apparatus such as the one disclosed in PTL 3, which utilizes reflection of light, infrared light, sonic waves, and the like, with no diffraction property (i.e., having a strong tendency to propagate in a straight line), the direction and angle of detection are limited. Hence, the apparatus of PTL 3 does not have sufficient capability of detecting the approach of a human body or the like from all directions, or requires a plurality of distance measuring sensors.

Accordingly, although the configurations of PTL 1 to PTL3 described above sense the surrounding conditions of an antenna to stabilize the antenna characteristics, none of them are preferable.

Embodiments according to the present disclosure can appropriately compensate antenna characteristics by detecting the surrounding conditions that cause a change in the antenna characteristics, where stable antenna characteristics are always maintained.

An antenna apparatus according to a first exemplary embodiment will now be described with reference to FIGS. 2 to 7.

Figure 1:
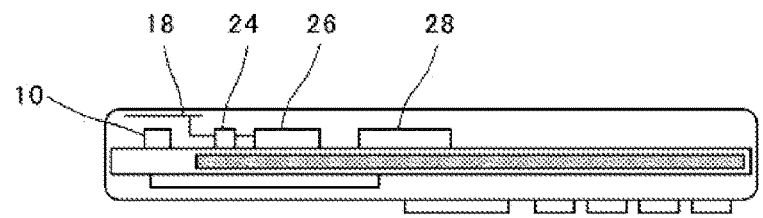
FIG. 1 is a diagram illustrating the configuration of the antenna apparatus described in PTL 2.
Figure 2A:
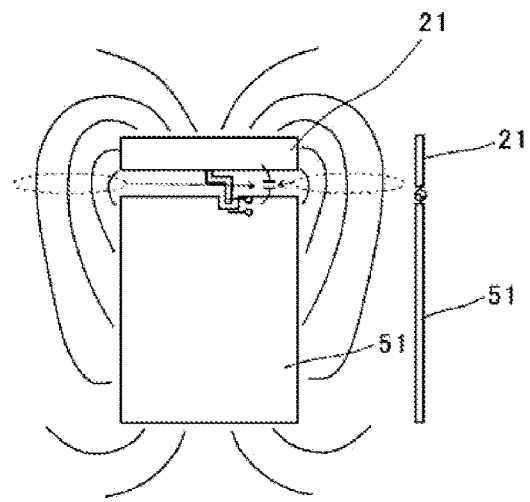
FIG. 2A is a schematic diagram illustrating an electric field formed between an antenna element electrode 21 and a substrate ground electrode 51 using electric lines of force.

As schematically illustrated using electric lines of force in FIG. 2A, an electric field is formed between an antenna element electrode 21 and a substrate ground electrode 51. With a high-frequency wave such as a wireless communication signal, an electromagnetic wave is radiated outward when the electric field alternates. With a direct current, a static electric field is formed.

The right side of FIG. 2A illustrates a pseudo dipole formed of the antenna element electrode 21 and the substrate ground electrode 51.

The antenna element electrode 21 and the substrate ground electrode 51 are considered to be the opposing electrodes of a capacitor which are connected through the electric lines of force described above, and the capacitance thereof is a stray capacitance that defines a resonant frequency.

Figure 2B:
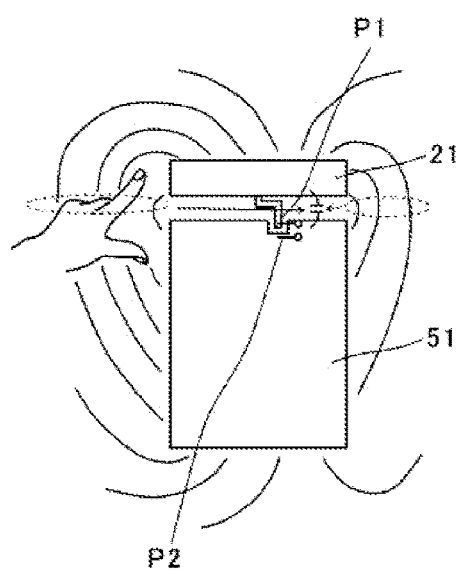
FIG. 2B illustrates a state in which part of a human body is in proximity to the antenna apparatus.

FIG. 2B illustrates a state in which part of a human body is in proximity to the antenna apparatus. When a human body (palm or fingers) thus approaches and enters the electric field, (since a human body is a dielectric with a high resistance), the electric lines of force are attracted to and enter [terminate at] the human body, whereby the capacitance (stray capacitance) between the antenna element electrode 21 and the substrate ground electrode 51 (between terminals P1 and P2 in FIG. 2B) is increased. This is equivalent to a state in which a dielectric has been inserted between the capacitor electrodes.

Hence, there is a close relationship between the degree of proximity of a human body to the antenna apparatus and a change in stray capacitance. The present disclosure is characterized in that this relationship is used for sensing the degree of proximity of a human body to the antenna apparatus and that the antenna element is used (dually used) for two functions, i.e., transmission/reception of electromagnetic waves of wireless communication signals and detection of the approach of a human body. Thereby, the problems described above are solved.

FIG. 3 illustrates two configurations of an antenna apparatus provided with a capacitance detection circuit 60 that detects the stray capacitance or a change in the stray capacitance.

Figure 3A:
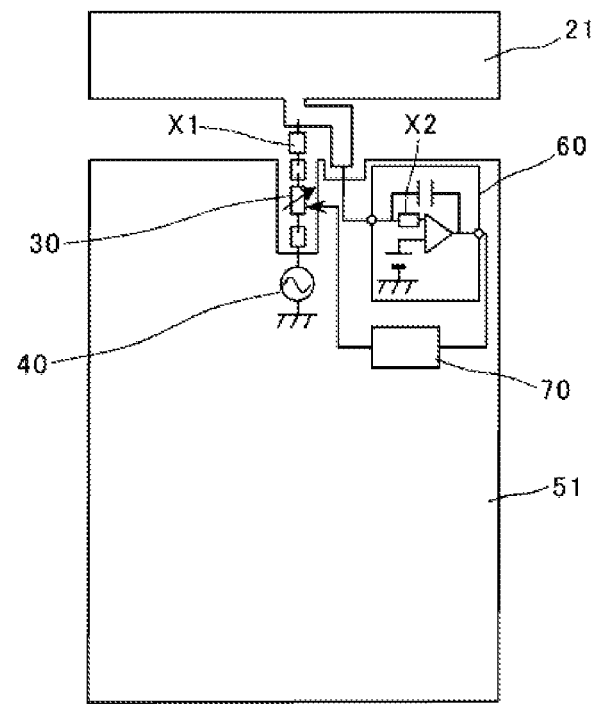
FIGS. 3A and 3B illustrate two configurations of an antenna apparatus according to a first exemplary embodiment.

Referring to FIG. 3A, a variable matching circuit 30 is provided on a wireless communication signal path, which is a transmission path between the antenna element electrode 21 and a feed circuit 40. Further, a reactance element X1 for preventing infiltration of a sensing signal to be detected by the capacitance detection circuit 60 is provided on the wireless communication signal path. In addition, a reactance element X2 for preventing leakage of a wireless communication signal fed to the antenna element electrode 21 or transmitted from the antenna element electrode 21 is provided on a sensing signal path, which is a transmission path between the antenna element electrode 21 and the capacitance detection circuit 60.

In FIG. 3A, the capacitance detection circuit 60, which forms a capacitance-voltage conversion circuit (C-v conversion circuit), converts a change in stray capacitance due to the approach of a human body into a change in voltage and outputs it. A feedback control circuit 70 supplies a control signal to the variable matching circuit 30 on the basis of a voltage that is output from the capacitance detection circuit 60. The variable matching circuit 30 is a reconfigurable matching circuit that performs matching in two frequency bands, a low band and a high band.

Figure 3B:
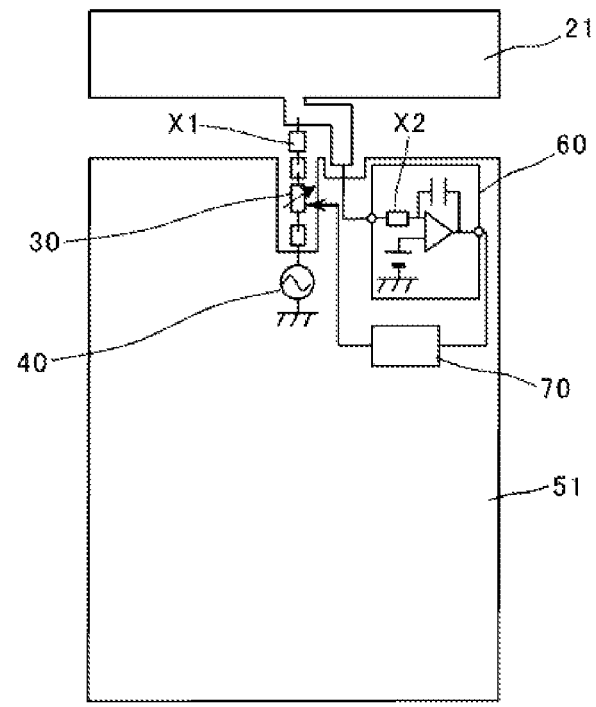

The antenna apparatus illustrated in FIG. 3A and the antenna apparatus illustrated in FIG. 3B are different from each other in terms of the insertion position of the reactance element X2. The insertion position of the reactance element X2 may be any place that prevents leakage of a wireless communication signal fed to the antenna element electrode 21 or transmitted from the antenna element electrode 21. Hence, the insertion position of the reactance element X2 may be, for example, a position illustrated in FIG. 3B, and thus not limited to the position illustrated in FIG. 3A.

Figure 4:
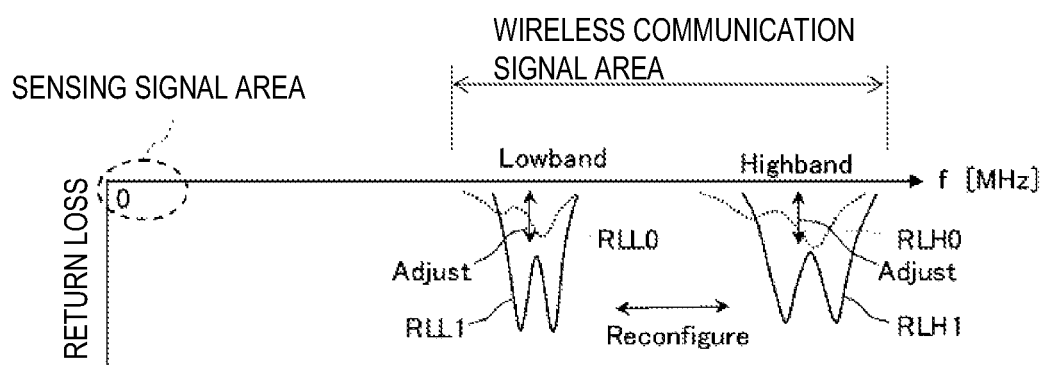
FIG. 4 is a diagram illustrating the operations of a capacitance detection circuit 60, a feedback control circuit 70, and a variable matching circuit 30 that form an antenna apparatus according to the first exemplary embodiment.

FIG. 4 is a diagram illustrating the operations of the capacitance detection circuit 60, the feedback control circuit 70, and the variable matching circuit 30. In FIG. 4, the horizontal axis represents frequency and the vertical axis represents return loss. This is an example of an antenna apparatus that performs communication in either of two bands, a low band and a high band. A low frequency signal with a frequency of zero (static electric field) or near zero is used to detect a stray capacitance.

When a human body approaches the antenna apparatus and, hence, the stray capacitance changes (increases), antenna matching will enter a mismatch state (return loss increases). However, the capacitance detection circuit 60 outputs a voltage corresponding to the increase in the stray capacitance, whereby the feedback control circuit 70 applies a control voltage corresponding to the increase in the stray capacitance to the variable matching circuit 30. As a result, the variable matching circuit 30, whose circuit constant has changed, returns to a proper matching state (a proper matching state is kept).

Referring to FIG. 4, a return loss waveform RLL0 in the low band is adjusted to a return loss waveform RLL1 through proper matching. Likewise, a return loss waveform RLH0 in the high band is adjusted to a return loss waveform RLH1 through proper matching.

Figure 5A:
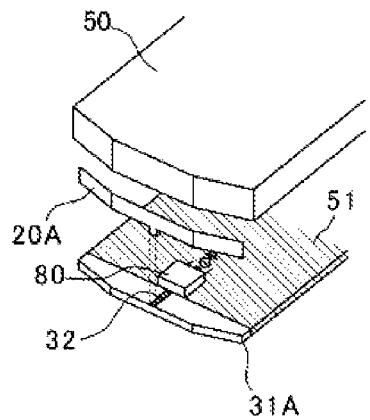
FIG. 5A and FIG. 5B are exploded perspective views of specific structures of two antenna apparatuses according to the first exemplary embodiment.
Figure 5B:
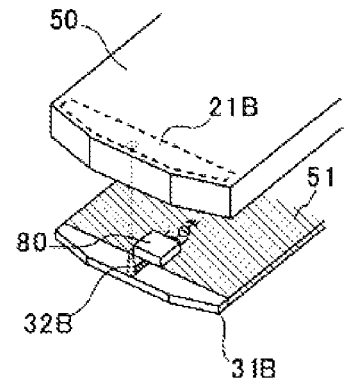

FIG. 5A and FIG. 5B are exploded perspective views of specific structures of two antenna apparatuses. Three-dimensional arrangement of the constituent components of antenna apparatuses may require that connection be made using spring terminals or contact pins. FIG. 5A and FIG. 5B illustrate examples of the arrangement.

In the example of FIG. 5A, an antenna element 20A formed by folding a metal plate is used. The antenna element 20A is soldered to or made to be in spring contact with an antenna connection portion 32 that is formed on a substrate 31A, and the upper side is covered by a casing 50. The end portions of the antenna element 20A and the substrate 31A are made to have shapes conforming to the shape of the casing 50 so as to prevent generation of an unnecessary space. In this example, the substrate 31A has an antenna matching module 80 mounted thereon that includes the capacitance detection circuit 60, feedback control circuit 70, reactance element X1, and variable matching circuit 30, in the form of a modular structure.

In the example of FIG. 5B, a pin-shaped antenna connection portion 32B is attached to a substrate 31B, an antenna element electrode 21B is provided on the inner surface of the casing 50, and the antenna connection portion 32B is connected using spring force to the antenna element electrode 21B in a state where the substrate 31B is covered by the casing 50. In this manner, the present invention can also be applied to a structure in which an antenna element is provided at a portion of a casing.

In addition, by directly forming an antenna element electrode in a non-ground area of a substrate, the antenna element may be formed on the substrate side.

Note that the present invention can be applied to both a case in which an antenna element is provided inside an area of a substrate in which a ground electrode is formed and a case in which the antenna element is provided outside of an area in which the ground electrode is formed (area in which the ground electrode is not formed) of the substrate.

Although the antenna element is represented as a plain plate in the above-described examples, the plate may have or not have patterning. Since the frequency band used in sensing is far from the frequency bands of wireless communication signals, even when a tuning pattern is formed on the antenna element electrode, the antenna element operates only as an opposing conductor for the stray capacitance in the frequency band used in sensing.

The patterning of the antenna element electrode may be patterning that allows resonance to be generated both in the fundamental mode and a harmonic mode by forming slits or branch-like shapes, patterning for realizing resonant points in a plurality of bands by inserting a reactance element into the antenna element, or patterning for dividing the antenna element into a feed element and a non-feed element.

An object to which the capacitance detection circuit is connected may be a non-feed element, a diversity antenna, or an antenna corresponding to frequency bands of different systems (for example, an antenna for Bluetooth and WLAN), covering a wide range of applications.

The variable matching circuit described above, which has wide-band two-resonance characteristics in two frequency bands, adjusts matching in accordance with the external conditions, however, not limited to this, the present invention can be applied to the following, for example:

(1) single-resonance circuit;
(2) π-type/T-type circuit configuration that includes therein a variable reactance element (without the concept of reconfiguration); and
(3) a plurality of matching circuits provided in advance, where the matching circuits are switched therebetween in accordance with the degree of proximity of a human body to the antenna apparatus.

Objects to be reconfigured are not limited to the cases of a low band [for example, GSM 800/900] and a high band [for example, DCS/PCS/UMTS]. Other systems (for example, WLAN/Bluetooth/Wimax) may be covered. Further, five bands (penta band) may be covered using finer division (in this case, prepared capacitance values are set in detail).

Figure 6:
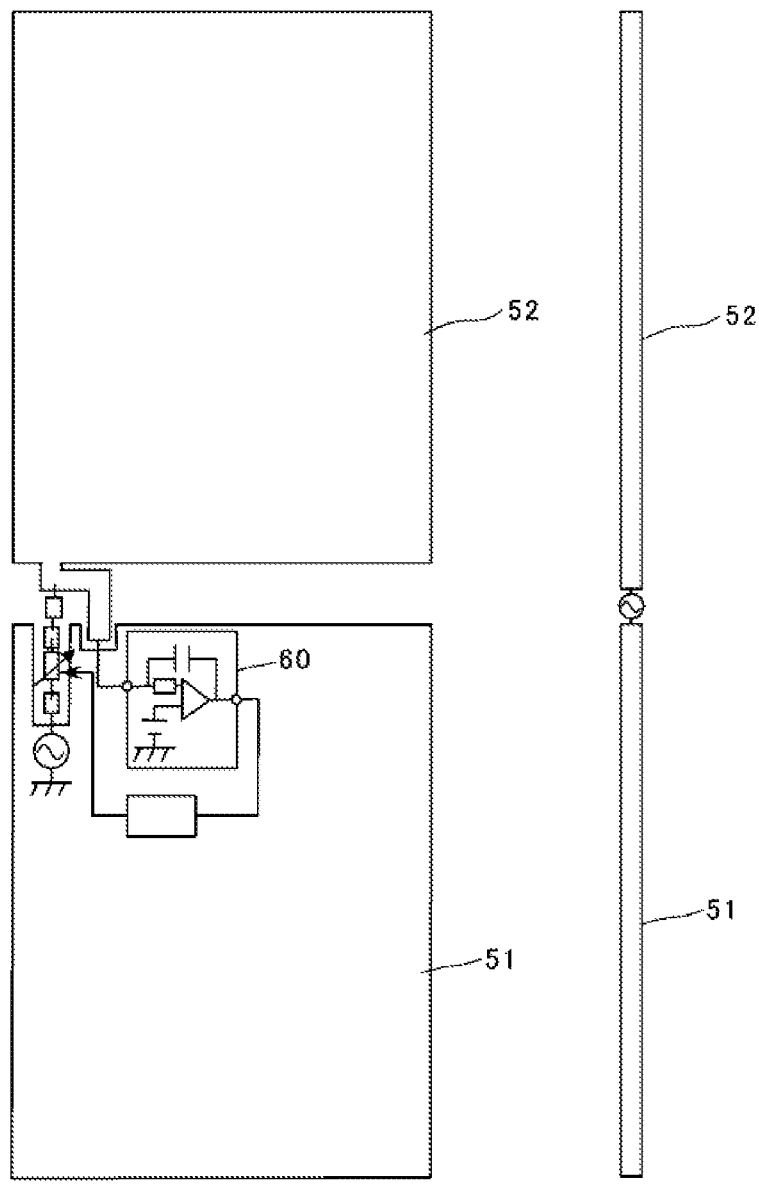
FIG. 6 is a diagram illustrating a configuration of another antenna apparatus according to the first exemplary embodiment.

FIG. 6 is a diagram illustrating a configuration of another antenna apparatus according to the first exemplary embodiment. In this example, a casing dipole is formed in a foldable (clamshell-type) cellular phone. The right side of FIG. 6 illustrates a pseudo dipole formed of a ground electrode 51 on the first substrate side and a ground electrode 52 on the second substrate side.

In the example illustrated in FIG. 6, a first substrate is housed in a first casing where operation keys and the like are provided and a second substrate is housed in a second casing where a liquid crystal display and a loudspeaker are provided. In this manner, a pseudo dipole may be formed of the ground electrodes of two substrates.

Embodiments consistent with the present disclosure can be applied to types of cellular phones other than a clamshell type, for example, a slide-type cellular phone or a swivel-type cellular phone.

In an embodiment, some or all of the capacitance detection circuit, the feedback control circuit, and the variable matching circuit can be provided on the liquid crystal display side substrate.

FIGS. 7A to 7D illustrate other examples that are different from the already illustrated examples in terms of the position of a substrate within a cellular phone and the positional relationship between the substrate and an antenna element.

Figure 7A:
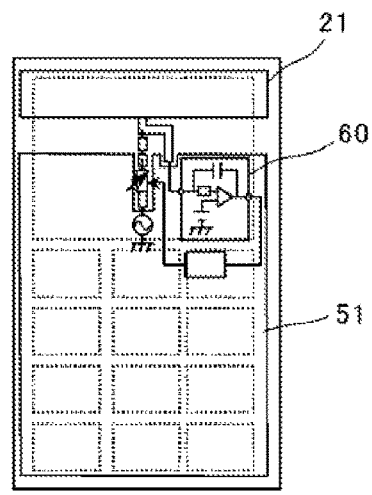
FIGS. 7A to 7D illustrate a number of examples regarding the position of a substrate within a cellular phone according to the first exemplary embodiment and the positional relationship between the substrate and an antenna element.
Figure 7B:
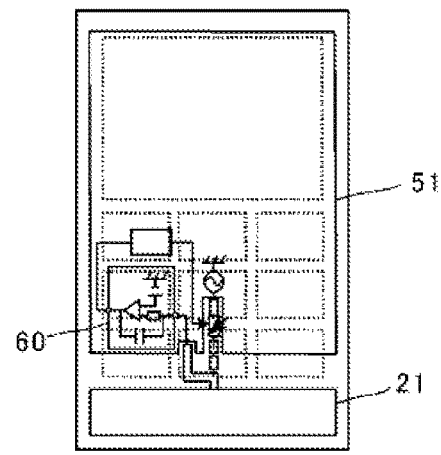

In both of the examples illustrated in FIG. 7A and FIG. 7B, the substrate ground electrode 51, the capacitance detection circuit 60, and the antenna element electrode 21 are provided in a single casing.

Figure 7C:
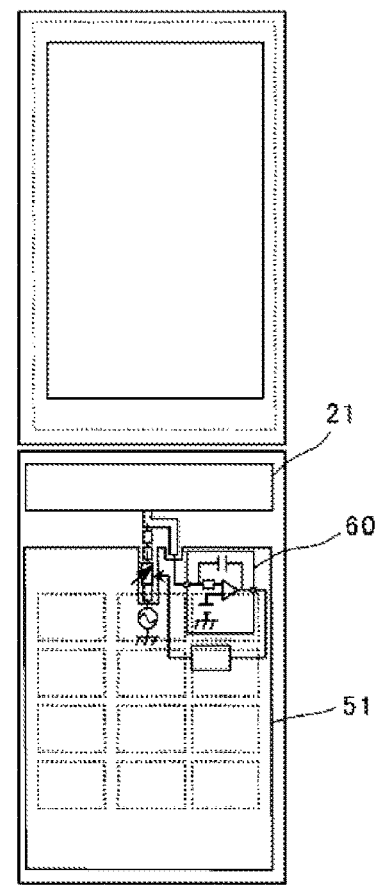
Figure 7D:
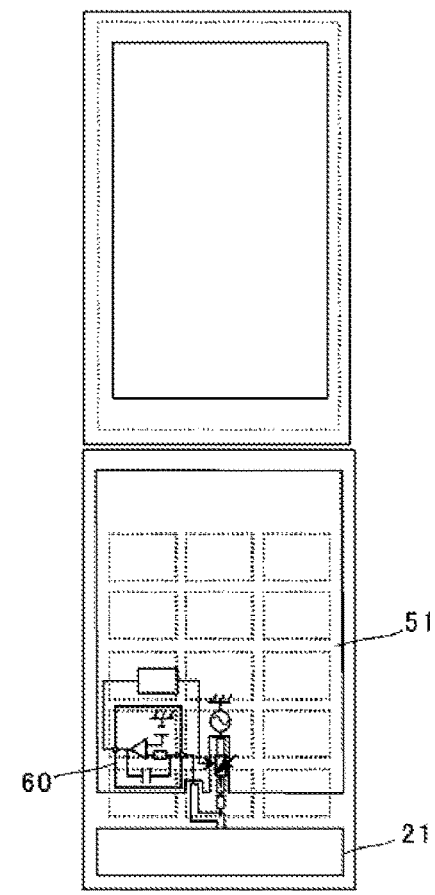

In the examples illustrated in FIG. 7C and FIG. 7D, the substrate ground electrode 51, the capacitance detection circuit 60, and the antenna element electrode 21 are provided in one half of a clamshell casing.

In the examples illustrated in FIG. 7A and FIG. 7C, the antenna element electrode 21 is provided in the upper portion of the substrate ground electrode 51.

In the examples illustrated in FIG. 7B and FIG. 7D, the antenna element electrode 21 is provided in the lower portion of the substrate ground electrode 51.

According to the exemplary embodiments described above, it is sufficient to add a capacitance-voltage conversion circuit or the like as an additional component, while keeping the antenna structure substantially as it is. This configuration, which has only small effects on the structural design, can be easily applied widely to a plurality of models.

In addition, a wireless communication signal path and a sensing signal path can coexist as components connected to the same antenna element. In other words, the effect of providing the capacitance-voltage conversion circuit on the wireless communication signal side characteristics (such as matching characteristics) is decreased and the effect in the opposite direction can also be decreased.

Further, the optimal design of the variable matching circuit is achieved in a variable matching state corresponding to the external condition, whereby maximum antenna efficiency is obtained.

Figure 8A:
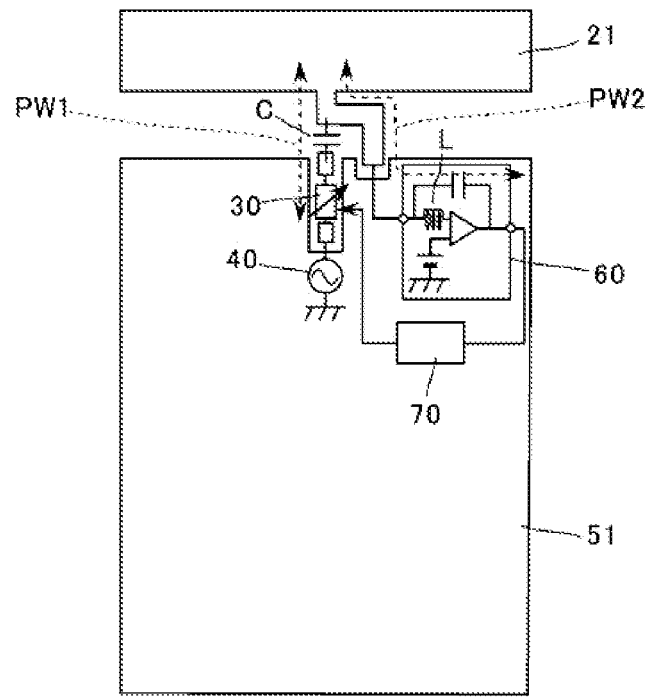
FIGS. 8A and 8B illustrate two configurations of an antenna apparatus according to a second exemplary embodiment.
Figure 8B:
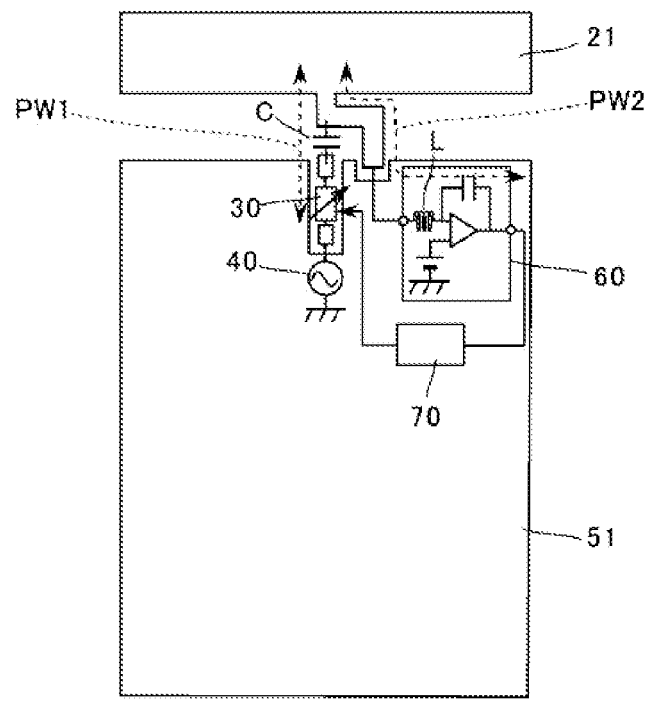

In a second exemplary embodiment, description is made regarding specific examples of a reactance element provided on a wireless communication signal path that is a transmission path between an antenna element and a feed unit and a reactance element provided on a sensing signal path that is a transmission path between the antenna element and a capacitance detection circuit. FIGS. 8A and 8B illustrate two configurations of an antenna apparatus according to the second exemplary embodiment.

Referring to FIG. 8A, a capacitor C is provided on a wireless communication signal path PW1 that is a transmission path between the antenna element electrode 21 and the feed circuit 40. An inductor L is provided on a sensing signal path PW2 that is a transmission path between the antenna element electrode 21 and the capacitance detection circuit 60.

Referring to FIG. 8A, since the capacitor C provided on the wireless communication signal path PW1 allows a wireless communication signal to pass therethrough but cuts off a DC current or a low frequency signal close to a DC current, prevents infiltration of a sensing signal detected by the capacitance detection circuit 60. Since the inductor L provided on the sensing signal path PW2 allows a DC current or a low frequency signal close to a DC current to pass therethrough but has a high impedance in the frequency band of a wireless communication signal, the capacitance detection circuit (provision of the capacitance detection circuit) does not affect the matching performed by the variable matching circuit 30.

The antenna apparatus illustrated in FIG. 8A and the antenna apparatus illustrated in FIG. 8B are different from each other in terms of the insertion position of the inductor L. The insertion position of the inductor L may be any place that prevents leakage of a wireless communication signal fed to the antenna element electrode 21 or transmitted from the antenna element electrode 21. Hence, the insertion position of the inductor L may be, for example, a position illustrated in FIG. 8B, and thus is not limited to the position illustrated in FIG. 8A.

Figure 9A:
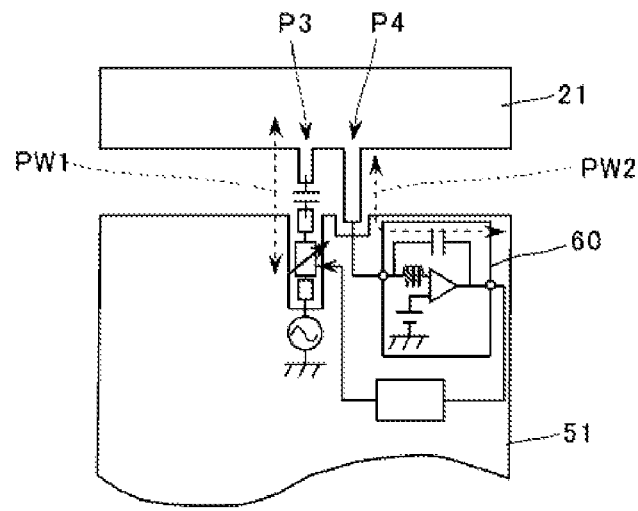
FIGS. 9A and 9B illustrate other configuration examples of an antenna apparatus according to the second exemplary embodiment.
Figure 9B:
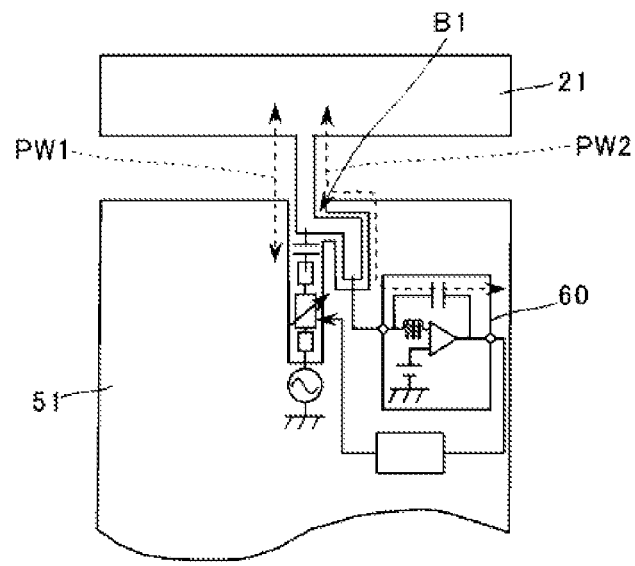

FIGS. 9A and 9B illustrate other configuration examples of an antenna apparatus according to the second embodiment.

In the example illustrated in FIG. 9A, the wireless communication signal path PW1 is connected to a port P3 of the antenna element electrode 21 and the sensing signal path PW2 is connected to a port P4 of the antenna element electrode 21.

In the example illustrated in FIG. 9B, a branching pattern that branches into the wireless communication signal path PW1 and the sensing signal path PW2 is formed using an electrode pattern on the substrate.

As can be seen, a branching portion that branches into the wireless communication signal path and the sensing signal path can be provided on the antenna element side or the substrate side, and thus is not limited to a position between the antenna element electrode and the substrate.

In a third embodiment, an exemplary specific configuration of a capacitance detection circuit is described.

Figure 10A:
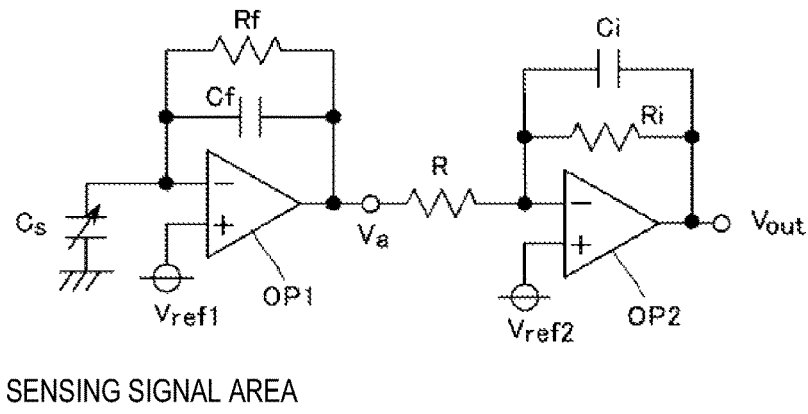
FIG. 10A is a circuit diagram of a capacitance detection circuit provided in an antenna apparatus according to a third exemplary embodiment.
Figure 10B:
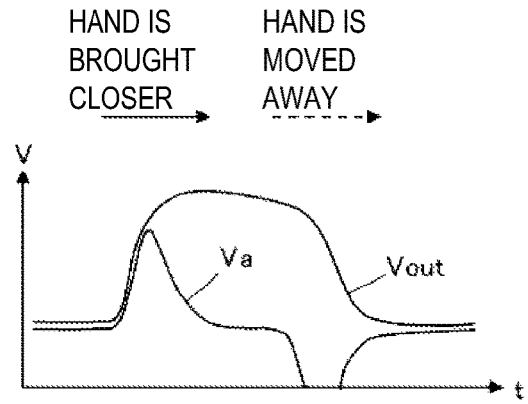
FIG. 10B is a waveform diagram illustrating the operations of the circuit.

FIG. 10(A) is a circuit diagram of a capacitance detection circuit provided in an antenna apparatus according to the third embodiment, and FIG. 10B is a waveform diagram illustrating the operations of the circuit.

Here, an operational amplifier is used for two purposes, i.e., for producing an output signal as a voltage signal and for amplification. A capacitance-voltage conversion circuit includes an inverting amplifier circuit formed of an operational amplifier OP1, a detection object capacitance Cs, and a feedback capacitance Cf. A reference potential Vref1 is applied to the non-inverting input terminal of the operational amplifier OP1. The principle of this capacitance-voltage conversion circuit is amplifying a change in voltage ($V=Q/C$) due to the input/output of electric charge between Cs and Cf caused by a change in the detection object capacitance Cs.

Since the operation of a feedback circuit formed of only Cs-Cf is unstable, a resistor Rf is connected in parallel with the feedback capacitance Cf. The resistor Rf is also a factor that determines a cut-off frequency f, i.e., a slowness factor, which is a time constant, of the input/output of electric charge between Cs and Cf. The resistance of the resistor Rf needs to be very large, in consideration of the time response of a "change in capacitance due to the approach of a human body" and a required holding time of that state.

The capacitance detection circuit according to the third embodiment is based on the assumption that an AC signal source such as a local oscillator does not exist. Hence, an integrating circuit using an operational amplifier is provided in a stage subsequent to the Cs-Cf feedback circuit. In other words, an inverting amplifier circuit using an operational amplifier OP2, a feedback circuit using a capacitor Ci and a resistor R form an integrating circuit. Note that a resistor Ri is connected in parallel with the capacitor Ci, thereby determining the integral time constant. A reference potential Vref2 is applied to the non-inverting input terminal of the operational amplifier OP2.

As illustrated in FIG. 10B, when a distance to a hand changes, an output voltage Va of the capacitance-voltage conversion circuit shows a voltage that is approximately proportional to the rate of change of the capacitance C, which is a detection object. An output voltage Vout of the integrating circuit, which is the integral of the output voltage Va, is a voltage corresponding to the length of the approach distance of a hand.

According to the capacitance detection circuit of the third embodiment, a signal source such as a local oscillator is not required. Hence, the capacitance detection circuit is simplified, and has an advantage in that the signal source does not become a noise source.

In a fourth exemplary embodiment, a specific example of a capacitance-voltage conversion circuit that uses an AC signal source is described.

Figure 11:
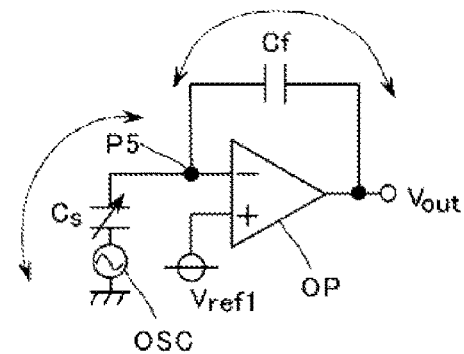
FIG. 11 is a diagram illustrating a basic configuration of a capacitance-voltage conversion circuit provided in an antenna apparatus according to a fourth exemplary embodiment.

FIG. 11 is a diagram illustrating a basic configuration of an exemplary capacitance-voltage conversion circuit using an oscillator. As shown in FIG. 11, a local oscillator OSC is connected in series with the detection object capacitance Cs. The reference potential Vref1 is applied to the non-inverting input terminal of an operational amplifier OP. Hence, a potential (input voltage of the operational amplifier OP) at a connection point P5 between the detection object capacitance Cs and the feedback capacitance Cf becomes a stable potential corresponding to the detection object capacitance. The oscillation frequency of the local oscillator OSC is a low frequency that is very close to a DC current compared with the frequency bands of wireless communication signals.

Figure 12A:
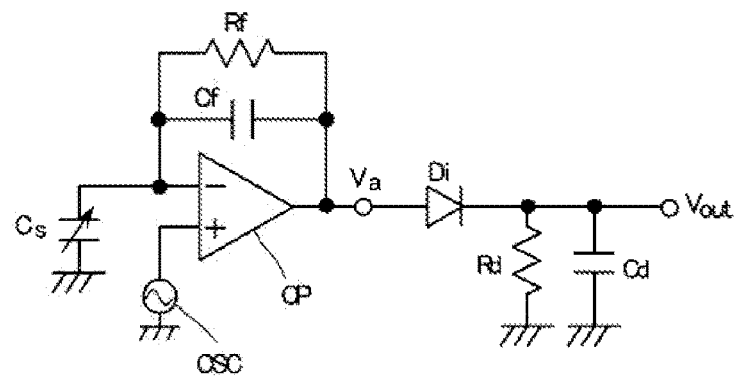
FIG. 12A is a circuit diagram of a capacitance detection circuit formed on the basis of the circuit illustrated in FIG. 11.
Figure 12B:
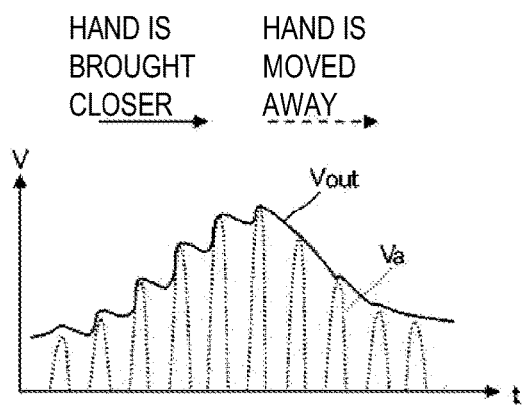
FIG. 12B is a waveform diagram illustrating an output voltage of the capacitance detection apparatus obtained by capacitance-voltage conversion.

FIG. 12A is a circuit diagram of a capacitance detection circuit formed on the basis of the circuit illustrated in FIG. 11, and FIG. 12B is a waveform diagram illustrating the output voltage of the capacitance detection circuit obtained by capacitance-voltage conversion.

In the example illustrated in FIG. 12A, the local oscillator OSC is connected to the non-inverting input terminal of the operational amplifier. The resistor Rf is connected in parallel with the feedback capacitance Cf. A detector circuit formed of a diode D1, a capacitor Cd, and a resistor Rd is connected to the output of the operational amplifier OP, whereby the envelope is output.

As illustrated in FIG. 12B, when a hand is brought closer, the amplitude of the output voltage Va increases with increasing value of the detection object capacitance Cs. Hence, the output voltage Vout of the detector circuit increases. When the hand is moved away, the output voltage Va decreases with decreasing value of the detection object capacitance Cs and, hence, the output voltage Vout decreases.

Note that a circuit that receives an AC signal from an AC signal source and outputs a signal as an AC output signal of a capacitance detection circuit is not limited to those illustrated in FIGS. 11 and 12A. Further, the output signal is not limited to a signal output as an AC voltage signal and, hence, the detector circuit may be changed to various circuits, accordingly.

In addition, a low pass filter that blocks an AC component may be provided other than a detection circuit, such as the envelope detection circuit of FIG. 12A.

Further, the position of the AC signal source is not limited to those in FIGS. 11 and 12A. For example, part of the high frequency circuit may be used as an AC signal source, rather than providing the separate local oscillator OSC. In other words, a certain AC signal may be obtained from the high frequency circuit.

In a fifth exemplary embodiment, selection of an antenna having a satisfactory radiation Q factor will be described.

In a word, the efficiency of an antenna apparatus according to the present disclosure depends on the radiation Q factor of an antenna element alone (antenna as a pseudo dipole including an antenna element and a ground electrode that contributes to radiation). However, the antenna element alone includes a loading reactance that sets the resonant frequency to a frequency in a desired frequency band. The antenna element is in a state where a capacitance detection circuit is loaded.

An antenna with a radiation Q factor as satisfactory (small) as possible is to be selected. This allows the maximum antenna efficiency and frequency band width to be achieved under the condition of a limited structural space.

Here "selection" means not only examining the quality of the radiation Q factor of an antenna, but also trying to prevent the arrangement of the sensing signal path from adversely affecting the radiation Q factor of the antenna.

In the fifth exemplary embodiment, this effect is verified by experiments.

Figure 13A:
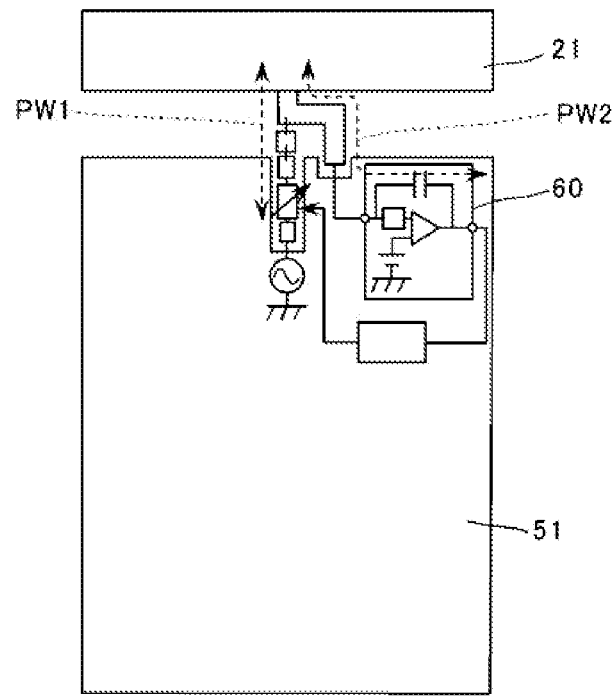
FIGS. 13A and 13B illustrate two configurations of an antenna apparatus according to a fifth exemplary embodiment.
Figure 13B:
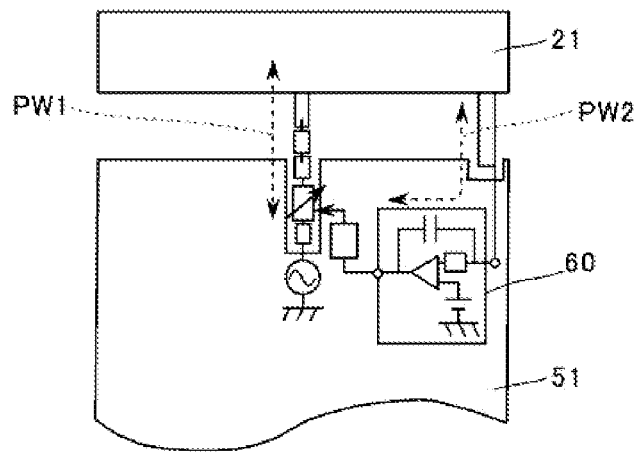

FIGS. 13A and 13B illustrate configurations of two types of antenna apparatus. FIG. 13A illustrates the antenna apparatus already described in the first embodiment. FIG. 13B illustrates an example in which the sensing signal path PW2 is arranged at a position considerably spaced apart from the wireless communication signal path PW1.

In the arrangement illustrated in FIG. 13B, the capacitance detection circuit 60 becomes an obstacle placed at a location hindering outward radiation. The conclusion is that in a configuration of a pseudo dipole with an optimally set radiation Q factor, it is preferable to employ a structure in which the wireless communication signal path PW1 is close to the sensing signal path PW2 to an extent that the sensing signal path PW2 and the wireless communication signal path are united (i.e., a structure in which branching into the wireless communication signal path PW1 and the sensing signal path PW2 occurs at a halfway point) or look substantially united compared with the wavelength.

In an antenna apparatus according to the present disclosure, antenna characteristics can be compensated through feedback based on detection of the surrounding conditions of the antenna at any time, not limited to the time of transmission. Further, since there is no need for a member other than the members required for radiation, antenna characteristics are not deteriorated. In addition, since reflection of light, infrared rays, sound waves, or the like is not used, the direction or angle of the detection is not limited, whereby a change in the antenna characteristics can be reliably detected.

Embodiments consistent with the present disclosure allow for compensating antenna characteristics through feedback based on detection of the surrounding conditions of the antenna at any time, and thus not limited only to the time of transmission. Further, since there is no need for a member other than the members required for radiation, antenna characteristics are not deteriorated. In addition, since reflection of light, infrared rays, sound waves, or the like is not used, the direction or angle of the detection is not limited, whereby a change in the antenna characteristics can be reliably detected.

In an embodiment where the antenna apparatus includes a reactance element on a wireless communication signal path that is a transmission path between the antenna element and the feed unit, where the reactance element prevents infiltration of a sensing signal to be detected by the capacitance detection circuit is provided, since the sensing signal does not leak to a wireless communication signal, the antenna characteristics are negligibly deteriorated.

In an embodiment where the antenna apparatus includes a reactance element on a sensing signal path that is a transmission path between the antenna element and the capacitance detection circuit, where the reactance element is configured to prevent leakage of a wireless communication signal fed to the antenna element or transmitted from the antenna element, the capacitance detection circuit does not affect the antenna element in wireless communication signal frequency bands, whereby the antenna characteristics are negligibly deteriorated.

In an embodiment in which the capacitance detection circuit is a capacitance-voltage conversion amplifier circuit that includes feedback capacitance in a feedback circuit of an inverting amplifier circuit, and that outputs a voltage which is approximately proportional to a ratio of a rate of change of detection object capacitance to the feedback capacitance, all that is needed is to additionally provide a capacitance-voltage conversion circuit or the like as an additional component, while keeping the antenna structure substantially as it is. This configuration, which has only small effects on the design of an electronic apparatus into which the antenna apparatus is integrated, can be easily applied to a plurality of models.

In an embodiment in which the capacitance-voltage conversion amplifier circuit includes an AC signal source that generates an AC signal having a frequency sufficiently lower than a resonant frequency of the antenna element, the AC signal source being provided in an input section of the inverting amplifier circuit, a wireless communication signal path and a sensing signal path can coexist as components connected to the same antenna element.

In an embodiment of an antenna apparatus in which a detector circuit is in an output section of the inverting amplifier circuit and is configured to detect an output signal of the inverting amplifier circuit, a stable detection value for a minute change in capacitance, which is a detection object, can be expected.

In an embodiment of an antenna apparatus in which an integrating circuit is in an output section of the inverting amplifier circuit and is configured to integrate an output voltage of the inverting amplifier circuit, a signal source for sensing such as a local oscillator can be omitted and, hence, the capacitance detection circuit can be simplified.

In an embodiment of the antenna apparatus in which the antenna element is an antenna element that, as the antenna element alone, has a satisfactory radiation Q factor among a plurality of types of antenna element that can be connected to an antenna connection section of the antenna matching circuit, a high-efficiency antenna can be realized by connecting an antenna having a satisfactory radiation Q factor to the antenna matching circuit.

Further, where selection conditions for the plurality of types of antenna element include a position of a feed point on the antenna element and a connection position of the capacitance detection circuit on the antenna element, an antenna element having a satisfactory radiation Q factor can be easily and reliably selected, whereby a high-efficiency antenna can be realized.

That which is claimed is:

1. An antenna apparatus, comprising:
a substrate ground electrode;
an antenna element electrode that forms an electric field with the substrate ground electrode and radiates an electromagnetic wave by the electric field;
an antenna matching circuit that performs antenna matching;
a capacitance detection circuit that detects a capacitance between the antenna element electrode and the substrate ground electrode, converts a change of the capacitance into a change of voltage, and outputs the change of the voltage; and
a feedback control circuit that controls the antenna matching circuit on the basis of the change of the voltage, wherein
the capacitance detection circuit is a capacitance-voltage conversion amplifier circuit that includes a feedback capacitance in a feedback circuit of an inverting amplifier circuit, and that outputs a voltage which is approximately proportional to a rate of change of a detection object capacitance to the feedback capacitance.

2. The antenna apparatus according to claim 1, further comprising:
a reactance element on a transmission path between a feed unit and the antenna element electrode, said reactance element on said transmission path configured to prevent infiltration of a sensing signal to be detected by the capacitance detection circuit.

3. The antenna apparatus according to claim 1, comprising:
a reactance element on a sensing signal path that is a transmission path between the antenna element electrode and the capacitance detection circuit, said reactance element on said sensing signal path configured to prevent leakage of a wireless communication signal fed to the antenna element electrode or transmitted from the antenna element electrode is provided.

4. The antenna apparatus according to claim 2, comprising:
a reactance element on a sensing signal path that is a transmission path between the antenna element electrode and the capacitance detection circuit, said reactance element on said sensing signal path configured to prevent leakage of a wireless communication signal fed to the antenna element electrode or transmitted from the antenna element electrode is provided.

5. The antenna apparatus according to claim 1, wherein the capacitance-voltage conversion amplifier circuit includes an AC signal source that generates an AC signal having a frequency sufficiently lower than a resonant frequency of the antenna element electrode, the AC signal source being provided in an input section of the inverting amplifier circuit.

6. The antenna apparatus according to claim 5, wherein a detector circuit is in an output section of the inverting amplifier circuit and is configured to detect an output signal of the inverting amplifier circuit.

7. The antenna apparatus according to claim 1, wherein the antenna element electrode is an antenna element electrode that, as the antenna element electrode alone, has a satisfactory radiation Q factor among a plurality of types of antenna element electrode that can be connected to an antenna connection section of the antenna matching circuit.

8. The antenna apparatus according to claim 7, wherein selection conditions for the plurality of types of antenna element electrode include a position of a feed point on the antenna element electrode and a connection position of the capacitance detection circuit on the antenna element electrode.

\* \* \* \* \*